United States Patent
Ganfield et al.

(10) Patent No.: US 7,272,699 B2
(45) Date of Patent: Sep. 18, 2007

(54) FLEXIBLE SUB-COLUMN TO SUB-ROW MAPPING FOR SUB-PAGE ACTIVATION IN XDR™ DRAMS

(75) Inventors: Paul Allen Ganfield, Rochester, MN (US); Ryan Abel Heckendorf, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 10/988,312

(22) Filed: Nov. 12, 2004

(65) Prior Publication Data

US 2006/0107019 A1     May 18, 2006

(51) Int. Cl.
*G06F 12/10* (2006.01)
(52) U.S. Cl. .................. 711/202; 711/154; 711/206; 711/212
(58) Field of Classification Search ............ None
See application file for complete search history.

(56) References Cited

U.S. PATENT DOCUMENTS

| | | | | |
|---|---|---|---|---|
| 6,108,745 A | * | 8/2000 | Gupta et al. | 711/3 |
| 6,889,307 B1 | * | 5/2005 | Scheuerlein | 711/202 |

* cited by examiner

*Primary Examiner*—Jasmine Song
(74) *Attorney, Agent, or Firm*—Francis Lammes; Stephen J. Walder, Jr.; D'Ann N. Rifai

(57) ABSTRACT

A method, a computer program, and an apparatus are provided for flexible SC to SR mapping to enable sub-page activation in an XDR™ memory system. An XDR™ memory system may allow system page size to reduced by a factor of two (half-page activation) or four (quarter-page activation). In an XDR™ memory system there are five different SCs and two different SRs. This scheme allows any one of the five SCs (or none) to be mapped to any one of the two SRs. Overall, this invention provides a flexible mapping scheme that can be utilized for any possible XDR memory system.

14 Claims, 3 Drawing Sheets

FLEXIBLE SUB-COLUMN TO SUB-ROW MAPPING FOR SUB-PAGE ACTIVATION IN XDR™ DRAMS

FIELD OF THE INVENTION

The present invention relates generally to address mapping for sub-page activation in XDR™ DRAMs, and more particularly, to a flexible method to map sub-column address bits to sub-row address bits for sub-page activation.

DESCRIPTION OF THE RELATED ART

With Extreme Data Rate (XDR™), available from Rambus, Inc., 4440 El Camino Real, Los Altos, Calif. 94022, the data transfer rate to and from memory has been dramatically increased. Some XDR™ DRAMs will be designed to allow sub-page activation, in which only a portion of a page is sensed during an Activate command. Sub-page activation limits system page size, which reduces activation power and therefore minimizes the burden on the power management/cooling solution and power supply decoupling network. XDR™ DRAM sub-page activation allows a page to be reduced in size by a factor of two or four.

XDR™ DRAMs have a native data width, but may be programmed to function with a narrower data width in order to increase system memory capacity. When XDR™ DRAMs are programmed in such a manner, the incremental column bits are referred to as sub-column address bits (SCs). As the programmed width gets smaller, the number of SCs utilized gets larger. The SCs are used within the DRAM to select the target section of the page, and to control the routing of data to and from that section. If extremely narrow (like x1) XDRυ DRAMs are created that will use sub-page activation, certain column bits will be artificially named as sub-column bits in the data sheet to indicate that they are to be mapped to the sub-row bits. Note that "real" SCs are not possible with such a part. Therefore, sub-column bits are always mapped to sub-row bits; column bits never are.

Sub-page addressing is handled via the use of sub-row address bits (SRs). XDR™ DRAMs may use up to two SRs (some use no SRs), allowing page size to be reduced by a factor of two (half-page activation) or four (quarter-page activation). SRs are typically mapped to carry the same address bits as the most-significant SCs, since SCs are used for datapath routing control. However, the exact mapping for future XDR™ DRAMs is not fully determined and may change.

SUMMARY OF THE INVENTION

The present invention provides a method, a computer program, and an apparatus for flexible SC-to-SR mapping to enable sub-page activation in an XDR™ memory system. An XDR™ memory system may use up to two SRs, which means system page size may be reduced by a factor of two (half-page activation) or four (quarter-page activation). In an XDR™ memory system there are five different SCs and two different SRs. Different XDR™ DRAMs and different configurations of these DRAMs require different SC-to-SR mapping. This scheme allows any one of the five SCs to be mapped to any one of the two SRs. This scheme can also be employed to map none of the SCs to the SRs. Overall, this invention provides a flexible mapping scheme that can be utilized for any possible XDR™ memory system.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

To support sub-page activation a memory controller must be able to map SCs to SRs. The Address Massager logic in the memory controller does the translation of real addresses to the corresponding physical addresses, which are then used in DRAM commands. With SC-to-SR mapping information and the rest of the physical address already created, the Address Massager logic generates the SRs.

Figure 1:
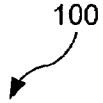
FIG. 1 is a table describing the mappings between SCs and SRs that the memory controller allows.

Referring to FIG. 1 of the drawings, reference numeral 100 generally designates a table describing the mappings between SCs and SRs that the memory controller allows. This is normally controlled by software and should be flexible enough to handle any such mappings that XDR™ DRAMs may require. There are five SCs that may be used in XDR™ memory systems: SC4, SC3, SC2, SC1, and SC0. There are two SRs that may be used in XDR™ memory systems: SR1 (msb) and SR0 (lsb). In half-page activation one SR is used (SR1), and in quarter-page activation both SRs are used (SR1 and SR0).

Table 100 shows that two 5-bit, values control the SC-to-SR mapping. For the SC to SR1 mapping, "00000" denotes that SR1 is not used. "10000" denotes that SC4 gets mapped to SR1. "01000" denotes that SC3 gets mapped to SR1. "00100" denotes that SC2 gets mapped to SR1. "00010" denotes that SC1 gets mapped to SR1. Lastly, "00001" denotes that SC0 gets mapped to SR1. For SC to SR0 mapping, "00000" denotes that SR0 is not used. "10000" denotes that SC4 gets mapped to SR0. "01000" denotes that SC3 gets mapped to SR0. "00100" denotes that SC2 gets mapped to SR0. "00010" denotes that SC1 gets mapped to SR0. Lastly, "00001" denotes that SC0 gets mapped to SR0.

Figure 2:
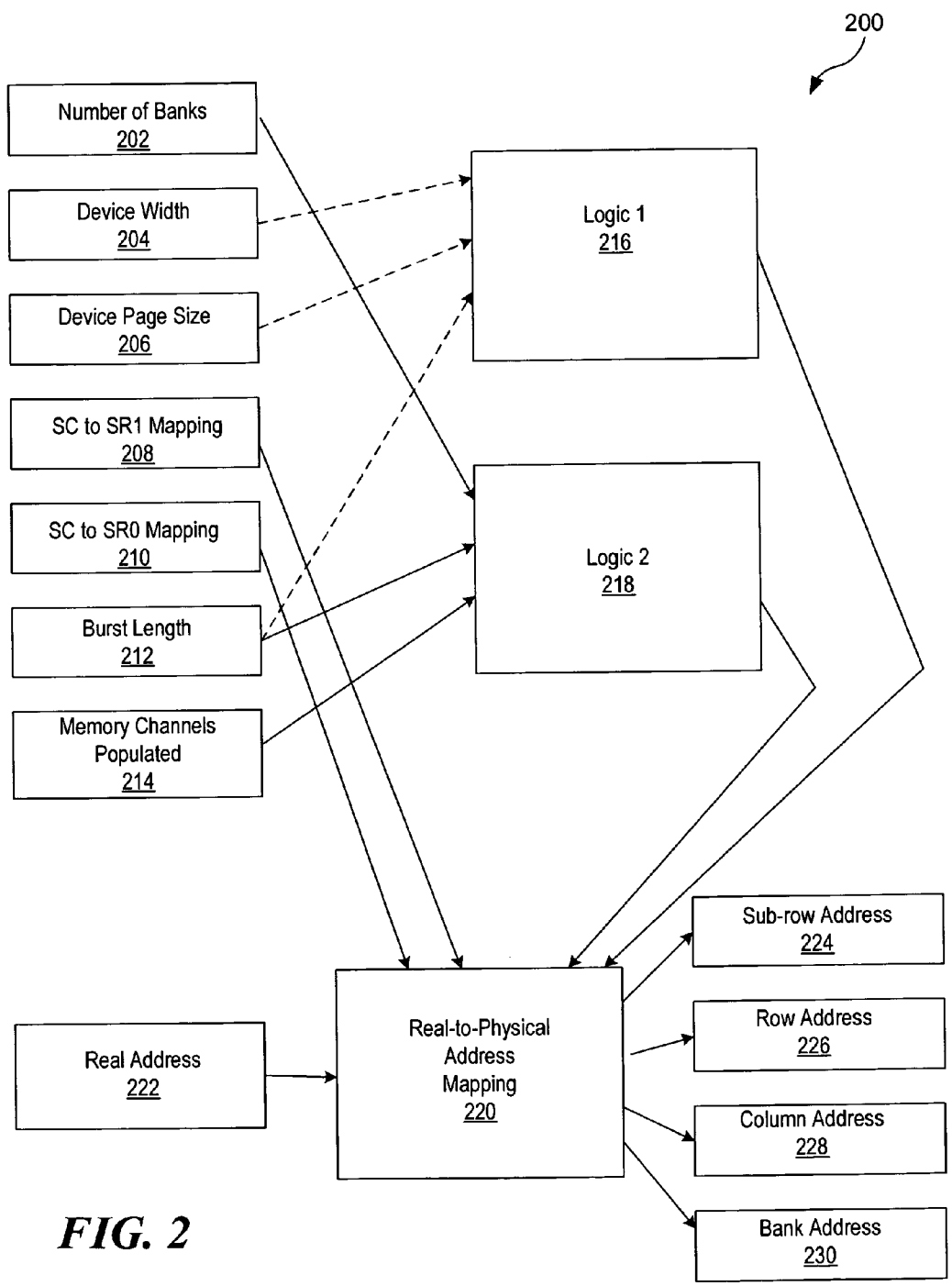
FIG. 2 is a block diagram illustrating the transformation process from real address to physical address that is accomplished by the Address Massager logic.

Referring to FIG. 2 of the drawings, reference numeral 200 illustrates the transformation process from real address to physical address that is done by the Address Massager logic. There are many variables (inputs) that determine how the real address is transformed into the physical address. The number of banks 202 refers to the number of internal banks in the XDR™ DRAMs that are used. The device width 204 denotes the data width of the XDR™ DRAMs that are used. This is the native width, unless the XDR™ DRAMs are programmed to a narrower width. The device page size 206 refers to the page size of the XDR™ DRAMs that are used. The SC to SR1 mapping 208 refers to the SC-to-SR1 mapping choice that is selected (see FIG. 1). The SC to SR0 mapping 210 refers to the SC-to-SR0 mapping choice that is selected (see FIG. 1). The burst length 212 signifies the burst length of the XDR™ DRAMs that are used. The memory channels populated 214 signifies which memory channels are being used.

There are two separate logic boxes 216 and 218 that produce outputs to aid in the transformation. Logic box 216 receives inputs from the device width 204, device page size 206, and burst length 212. The output of logic box 216 is fed into the real-to-physical address mapping box 220. Logic box 218 receives inputs from the number of banks 202, burst length 212, and memory channels populated 214. The output of logic box 218 is fed into the real-to-physical address mapping box 220, also. The real-to-physical address mapping box 220, which does the real address to physical address transformation, receives other inputs as well. The SC to SR1 mapping 208, and the SC to SR0 mapping 210 are received by the real-to-physical address mapping box 220. The real address 222 is another input to the real-to-physical address mapping box 220. SC to SR1 mapping 208 informs the real-to-physical address mapping box 220 which specific sub-column address bit that has just been generated is mapped to SR1. SC to SR0 mapping 210 informs the real-to-physical address mapping box 220 which specific sub-column address bit that has just been generated is mapped to SR0.

Sub-row address 224, row address 226, column address 228, and bank address 230 are outputs from the Address Massager logic. All of these outputs (224, 226, 228, and 230) combined are the physical address. These outputs (224, 226, 228, and 230) are directly used in the DRAM commands that accomplish the specific transaction, such as a read or a write of memory.

Table 100 shows how an XDR™ memory controller can offer maximum flexibility with regard to the SC-to-SR mapping. The register fields control the SC to SR1 mapping 208 and the SC to SR0 mapping 210. Since any SC bit may be mapped to any SR bit by software, the memory controller is able to support sub-page activation for any future XDR™ DRAMs, even though the exact mappings for such parts are not yet known. The table of FIG. 1 is only one example of employing values to control SC to SR mapping. The core of this invention is the flexible SC to SR mapping concept.

Figure 3:
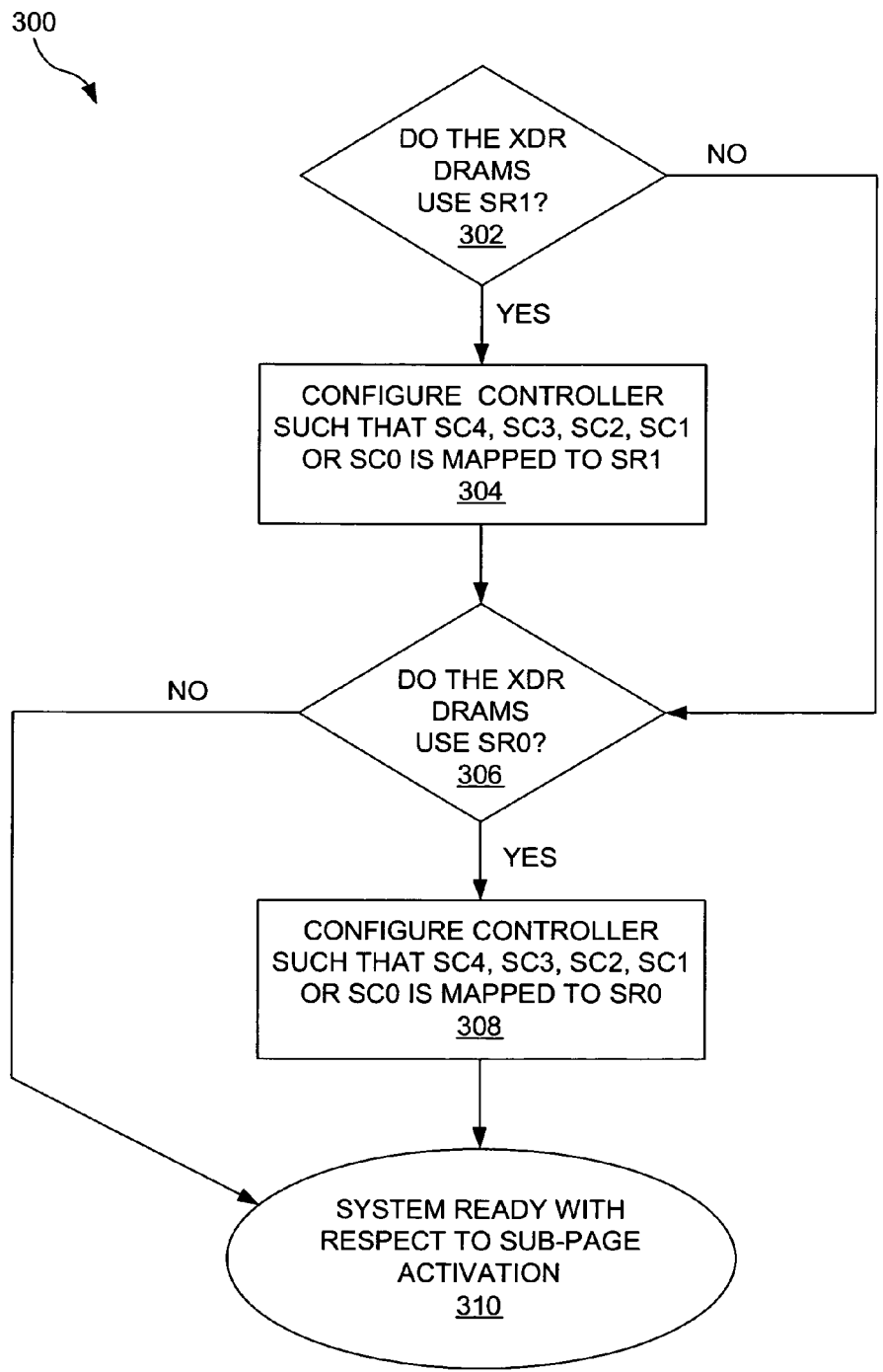
FIG. 3 is a flow chart depicting the possible SC to SR mappings in order to support differing XDR™ DRAM implementations.

Referring to FIG. 3 of the drawings, reference numeral 300 generally designates a flow chart depicting the possible SC to SR mappings in order to support differing XDR™ DRAM implementations. First, do the selected XDR™ DRAMs use SR1 302? If SR1 is used, then the memory controller must be configured so that SC4, SC3, SC2, SC1, or SC0 is mapped to SR1 304. If SR1 is not used, then process step 304 is skipped. Second, do the selected XDR™ DRAMs use SR0 306? If SR0 is used, then the memory controller must be configured so that SC4, SC3, SC2, SC1, or SC0 is mapped to SR0 308. If SR0 is not used, then process step 308 is skipped. After these decisions have been made and the corresponding actions taken, the XDR™ memory system is ready with respect to sub-page activation 310.

It is understood that the present invention can take many forms and embodiments. Accordingly, several variations of the present design may be made without departing from the scope of the invention. The capabilities outlined herein allow for the possibility of a variety of programming models. This disclosure should not be read as preferring any particular programming model, but is instead directed to the underlying concepts on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for mapping cells in a memory system having a plurality of sub-column bits and a plurality of sub-row bits to facilitate memory system implementations, comprising:
   determining a memory system implementation used by the memory system;
   mapping at least one sub-column bit to at least one sub-row bit based on the memory system implementation used by the memory system; and
   activating a sub-page of the memory system based on the mapping of the at least one sub-column bit to the at least one sub-row bit, wherein determining the memory system implementation used by the memory system comprises determining a mapping selection for mapping the at least one sub-column bit based on at least one of a first sub-row mapping or a second sub-row mapping in the memory system.

2. The method of claim 1, wherein mapping cells in the memory system having the plurality of sub-column bits and the plurality of sub-row bits, further employing at least one of five sub-column bits.

3. The method of claim 2, wherein mapping cells in the memory system having the plurality of sub-column bits and the plurality of sub-row bits, further employing at least one of two sub-row bits.

4. The method of claim 1, wherein mapping the at least one sub-column bit to the at least one sub-row bit based on the memory system implementation used by the memory system, further comprises mapping at least two sub-column bits to at least two sub-row bits for at least one of the memory system implementations.

5. The method of claim 1, wherein the memory system is an Extreme Data Rate (XDR) memory system.

6. A computer program product for mapping cells in a memory system having a plurality of sub-column bits and a plurality of sub-row bits to facilitate memory system implementations, with the computer program product having a medium with a computer program embodied thereon, wherein the computer program comprises:
   computer code for determining a memory system implementation used by the memory system;
   computer code for mapping at least one sub-column bit to at least one sub-row bit based on the memory system implementation used by the memory system; and
   computer code for activating a sub-page of the memory system based on the mapping of the at least one sub-column bit to the at least one sub-row bit, wherein determining the memory system implementation used by the memory system comprises determining a mapping selection for mapping the at least one sub-column bit based on at least one of a first sub-row mapping or a second sub-row mapping in the memory system.

7. The computer program product of claim 6, wherein the computer code for mapping cells in the memory system having the plurality of sub-column bits and the plurality of sub-row bits, further comprises computer code for employing at least one of five sub-column bits.

8. The computer program product of claim 7, wherein the computer code for mapping cells in the memory system having the plurality of sub-column bits and the plurality of sub-row bits, further comprises computer code for employing at least one of two sub-row bits.

9. The computer program product of claim 6, wherein the computer code for mapping the at least one sub-column bit to the at least one sub-row bit based on the memory system implementation used by the memory system, further comprises computer code for mapping at least two sub-column bits to at least two sub-row bits for at least one of the memory system implementations.

10. The computer program product of claim 6, wherein the memory system is an Extreme Data Rate (XDR) memory system.

11. An apparatus for mapping cells in a memory system having a plurality of sub-column bits and a plurality of sub-row bits to facilitate memory system implementations, comprising:

determining logic that is configured to determine the memory system implementation used by the memory system;

a mapping module that is at least configured to map at least one sub-column bit to at least one sub-row bit based on the memory system implementation used by the memory system; and activation logic for activating a sub-page of the memory system based on the mapping of the at least one sub-column bit to the at least one sub-row bit, wherein determining the memory system implementation used by the memory system comprises determining a mapping selection for mapping the at least one sub-column bit based on at least one of a first sub-row mapping or a second sub-row mapping in the memory system.

12. The apparatus of claim 11, wherein the memory system having the plurality of sub-column bits and the plurality of sub-row bits, further comprises the mapping module employing at least one of five sub-column bits and at least one of two sub-row bits.

13. The apparatus of claim 11, wherein the mapping module is at least configured to map at least two sub-column bits to at least two sub-row bits for at least one of the memory system implementations.

14. The apparatus of claim 11, wherein the memory system is an Extreme Data Rate (XDR) memory system.

* * * * *